United States Patent
Potter et al.

(10) Patent No.: US 6,444,563 B1
(45) Date of Patent: *Sep. 3, 2002

(54) METHOD AND APPARATUS FOR EXTENDING FATIGUE LIFE OF SOLDER JOINTS IN A SEMICONDUCTOR DEVICE

(75) Inventors: Scott G. Potter, Coconut Creek; Joseph Guy Gillette, Margate; Jesse E. Galloway, Hialeah, all of FL (US); Zane Eric Johnson, Austin, TX (US); Pradeep Lall, Chicago, IL (US)

(73) Assignee: Motorlla, Inc., Schaumburg, IL (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/253,876

(22) Filed: Feb. 22, 1999

(51) Int. Cl.[7] .......................... H01L 21/44; H01L 23/48; H01L 23/52; H01L 29/40; B23K 31/00; B23K 31/02
(52) U.S. Cl. ..................... 438/615; 438/612; 438/613; 257/737; 257/779; 228/180.22
(58) Field of Search ................................ 438/612, 613, 438/615, 616; 257/737; 228/180.22

(56) References Cited

U.S. PATENT DOCUMENTS

| | | | |
|---|---|---|---|
| 3,871,015 A | | 3/1975 | Lin et al. |
| 5,266,520 A | * | 11/1993 | Cipolla et al. ............... 437/183 |
| 6,020,561 A | * | 2/2000 | Ishida et al. ................ 174/261 |
| 6,066,551 A | * | 5/2000 | Satou ......................... 438/613 |

OTHER PUBLICATIONS

Katchmar et al., "Influencing Solder Joint Dependability in Area Array Packages," The International Journal of Microcircuits and Electronic Packaging, vol. 20, No. 4, Fourth Quarter, pp. 545–555 (1997).

Satoh et al. "Development of a New Micro–Solder Bonding Method for VLSIs," Proceedings of the Technical Conference, 3rd Annual International Electronics Packaging Conference, pp. 455–461 (1983).

Matsui et al., "VLSI Chip Interconnection Technology Using Stacked Solder Bumps," Proceedings of 37th Electronic Components Conference, pp. 573–578 (1987).

* cited by examiner

Primary Examiner—Tuan H. Nguyen
Assistant Examiner—Nema Berezny
(74) Attorney, Agent, or Firm—Daniel D. Hill

(57) ABSTRACT

A ball grid array (BGA) or chips scale package (CSP) integrated circuit (IC) (20) is manufactured by first identifying the most unreliable solder ball joints in the IC. These worst case joints, or joints in the vicinity of the worst case joints, are changed in pad dimension and exposed to more ball/bump conductive material than the other more robust joints (14) in the IC (20) to create a ball (24) on a larger pad (22) that is larger than the normal sized ball (14). The larger balls (24) are formed by placing multiple smaller balls (14) together on a single pad (22) to form one larger ball (24) during a reflow operation. The larger ball (24) improves the overall IC reliability by improving the reliability of the weakest joints in the IC design. In addition, the standoff of both the larger balls (24) and the smaller balls (14) are engineered to be substantially equal.

9 Claims, 3 Drawing Sheets

BEFORE REFLOW

AFTER REFLOW

BEFORE REFLOW             AFTER REFLOW

METHOD AND APPARATUS FOR EXTENDING FATIGUE LIFE OF SOLDER JOINTS IN A SEMICONDUCTOR DEVICE

FIELD OF THE INVENTION

This invention relates generally to semiconductor devices, and more particularly, to a method and apparatus for extending fatigue life of a semiconductor device.

BACKGROUND OF THE INVENTION

In the integrated circuit (IC) industry, ball grid array (BGA), chip scale packaging (CSP), and flip chip packaging technologies are beginning to gain wide acceptance and application. A general example of BGA or CSP technology is illustrated in FIGS. 1–2 herein. Specifically, FIG. 1 illustrates an integrated circuit die 10 that has bond pads 12 arranged in some two-dimensional layout across the IC's top surface. These bond pads 12 are exposed conductive regions that are coupled to underlying electrical components on the IC 10. Through this coupling, the bond pads 12 allow the circuitry on the IC 10 to be electrically connected to other external devices, other peripherals, or other ICs over conductive traces of a printed circuit board (PCB) or other substrate whereby larger electrical systems may be created (e.g., a computer, a cell phone, a television, etc.). In the prior art FIG. 1, all bond pads 12 that electrically connect to circuitry on the die 10 are made the same size. This same or uniform bond pad size is usually set at a minimal size so that IC die area is optimally reduced thereby improving the profitability and performance of the IC. A uniform bond pad size also reduces manufacturing costs by simplifying the pad design and IC back-end processing.

FIG. 2 illustrates that only one conductive ball or conductive bump 14 is formed over each conductive bond pad 12 from FIG. 1. In FIG. 2, each of the balls or bumps 14 are of a uniform size (i.e., a uniform volume of material is used to form each bump in FIG. 2). Such uniform bump sizes are utilized in the industry to ensure a simple, low cost, high yield process while also ensuring that all bumps on the IC 10 are of the same standoff height. Standoff height is the distance a bump 14 rises above the top surface of the die 10 to which it is attached. It is desirable that all bumps 14 in FIG. 2 rise a same vertical distance off the substrate 10. If bumps 14 were to be formed having different heights over the die 10, some tall bumps 14 may make electrical contact to a planar printed circuit board (PCB) while shorter bumps 14 may not make sufficient electrical contact to the PCB, whereby unacceptable electrical open circuits result. To ensure proper and uniform standoff height, the simple and uniform approach of forming a BGA or CSP design has been extensively used. In addition, by using this more simple uniform pad design, manufacturing costs are reduced whereby profit is maximized.

However, the bump technologies that use all uniformly sized bumps and uniformly sized bond pads have exhibited reduced field reliability primarily due to the smaller solder balls and smaller resultant solder joints between the IC substrate and the PCB. Smaller solder balls are required in most designs in order to meet the small size requirements for CSP devices, but the smaller sizes result in the formation of more fragile solder joint locations that can lead to a variety of field reliability failures. The overall IC device is only as good as its most fragile or most stressed solder joint. As a simple example, assume a BGA or CSP device has 5 solder joints or terminals, and that the reliability of these joints (a relibility value of 1 being the best and 9 being the worst) are 1, 2, 2, 4, and 9 respectively. In this design, the worst-case joint of 9 is the worst case joint. If one could improve the joint having a reliability value of 9 to a reliability value of 7, or any reliability value better than 9, the robustness of the example device would be greatly improved. If the reliability of the joint with the reliability value of 9 were increased to a reliability value of 2, then the new worst case joint would become the joint with the reliability value of 4. This is a substantial improvement over the previous design.

Therefore, a need exists in the industry for a method of selectively identifying and improving one or more worst case joints in an IC design whereby overall product reliability is greatly improved while the compactness of CSP and BGA devices is not substantially and adversely affected.

BRIEF DESCRIPTION OF THE DRAWINGS

The present invention is illustrated by way of example and not limited in the accompanying figures, in which like references indicate similar elements, and in which.

DESCRIPTION OF A PREFERRED EMBODIMENT

Generally, the present invention provides a ball grid array (BGA) semiconductor device and a method for forming a BGA semiconductor device with solder joints having extended thermal fatigue life. Fatigue life is extended by increasing the area of selected pads of the semiconductor device and the amount, or volume, of solder on the pads. The increased area pads are located at strategic locations, depending on the package type, throughout the ball grid array to gain a desired overall fatigue life improvement of the solder joints. Increased volume solder balls are formed by including multiple solder balls in close proximity to each other on the same increased area pad. The multiple solder balls on the increased area pad thermally merge into one solder ball during the reflow process step. The present invention may be useful in any type of packaging technology that includes solder balls, or solder bumps, such as for example, BGA, CSP (chip scale package) and flip chip. The present invention may also be useful in different types of bump forming technology, such as for example, the C4 (Controlled Collapse Chip Connection) bump process or the E3 (Extended Eutectic Evaporative) bump process. The present invention will be further described with reference to FIGS. 3–8.

Figure 1:
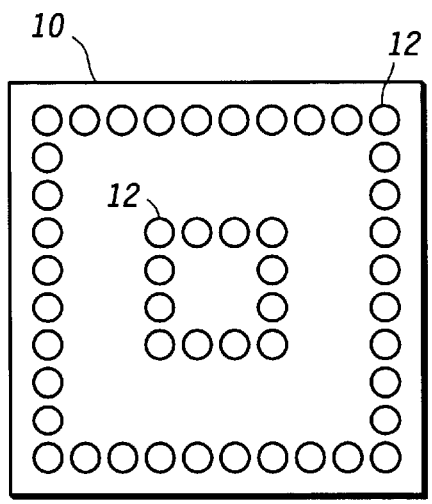
FIG. 1 illustrates a plan view of a prior art ball grid array without solder balls attached.
Figure 2:
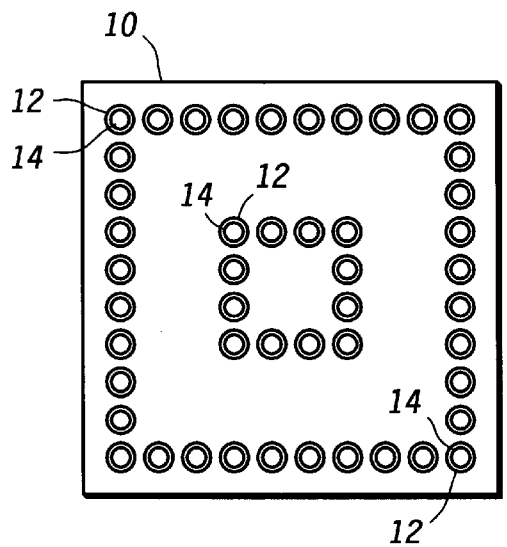
FIG. 2 illustrates a plan view of a prior art ball grid array package with solder balls.
Figure 3:
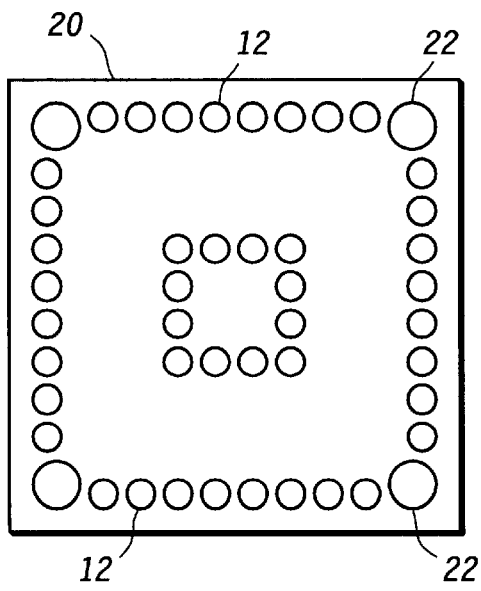
FIG. 3 illustrates a plan view of a ball grid array package without solder balls in accordance with one embodiment of the present invention.

FIG. 3 illustrates a plan view of a ball grid array package before the solder balls are attached in accordance with one embodiment of the present invention. In FIG. 3, metal pads 12 and 22 are formed on a semiconductor device 20. The metal pads are generally any number of conductive contact regions that are exposed at a top surface of the device 20 in order to enable electrical contact to electrical circuitry formed on the device 20. Semiconductor device 20 may be any device requiring solder balls and/or bumps to physically and electrically connect the device 20 to a printed circuit board. For example, semiconductor device 20 may be a substrate portion of a BGA package, or it may be a semiconductor material having metal pads for directly connecting to a PCB, such as in flip-chip technology. Device 20 may be a multi-chip module (MCM), a wafer scale integrated product, or like integrated circuit devices. Metal pads 12 and 22 may be formed from a conductive metal such as aluminum or copper, and serve as terminals for external connections of the semiconductor device 20. The semiconductor material, or die, may be composed of silicon or some other semiconductive material such as gallium arsenide, germanium silicon, silicon on insulator (SOI), silicon carbide, and/or the like. Electronic circuits are fabricated on the surface of the semiconductor material using a conventional semiconductor manufacturing process.

Metal pads 22 are illustrated as having a relatively larger surface area than metal pads 12. Metal pads 22 are located in areas of the semiconductor material 20 that have been identified as having a relatively lower solder joint fatigue life. In FIG. 3, metal pads 22 are located in the corners for illustration purposes only. The actual location of larger metal pads 22 is determined by actors such as the type of conponent substrate, ball grid array format, and critical component failure mode and may vary significantly from device to device. In an actual implementation, it may be desirable to locate the larger metal pads 22 at the package corners or at or near the center of the ball grid array.

During the manufacturing process, a solder ball, or bump, having a predetermined volume is attached to metal pads 12 and 22. The solder ball is either stencil printed, electroplated, deposited, or evaporated onto the metal pads 12 and 22 using conventional techniques, such as. for. example C4 and E3. In the illustrated embodiments, the solder balls are of conventional composition and are generally composed of tin and lead. However, in other embodiments, the solder may be composed of one or more other materials that are electrically conductive. A standoff height between the semiconductor device and a printed circuit board (PCB) is generally determined by the size of the metal pads and the volume of the solder balls. Therefore, the volume of solder included on the larger metal pads 22 should result in a standoff height that is substantially the same as the standoff height of the solder balls formed on metal pads 12 to ensure reliable solder joints.

Figure 4:
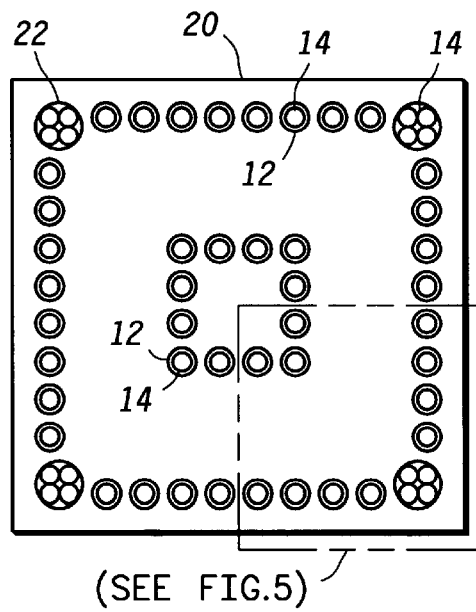
FIG. 4 illustrates a plan view of a ball grid array package with solder balls in accordance with one embodiment of the present invention.

FIG. 4 illustrates a plan view of a ball grid array package with the solder balls attached in accordance with one embodiment of the present invention. In FIG. 4, solder balls 14 are attached to metal pads 12 and 22 using a conventional method. Each of the smaller size metal pads 12 have been attached to a single solder ball 14. To achieve a larger volume solder ball on the larger metal pads 22 in the illustrated embodiment, multiple standard size solder balls 14 are attached in parallel with each other in the same plane and in very close proximity to one another on the same larger metal pads. The balls or bumps placed in FIG. 4 may be in contact with one another or may be physically spaced apart from one another. During reflow, the multiple solder balls 14 combine, or merge, to form a single larger solder ball. By using multiple solder balls to increase solder volume, a manufacturer's existing process for attaching uniformly sized balls does not have to be changed, thus manufacturing costs remain unchanged, and the larger solder joint results in improved overall reliability of the solder joints. Note that in the illustrated embodiments, the conductive contact regions are generally circular in shape. However, in other embodiments, the conductive contact regions may have other shapes, such as for example, square or rectangular.

In other embodiments, the larger solder balls 24 can be provided using additional solder that is either dispensed or screen printed onto the larger metal pads 22. Also, larger solder balls can be placed onto the larger metal pads 22. In addition, larger solder balls can be screen printed or dispensed onto the PCB metal pads, not shown, that correspond to the larger metal pads 22. However, a problem with using these alternate embodiments is that they may require a change to the existing method for attaching solder balls to BGA type packages. Also, new equipment may be necessary for including balls of different sizes.

Figure 5:
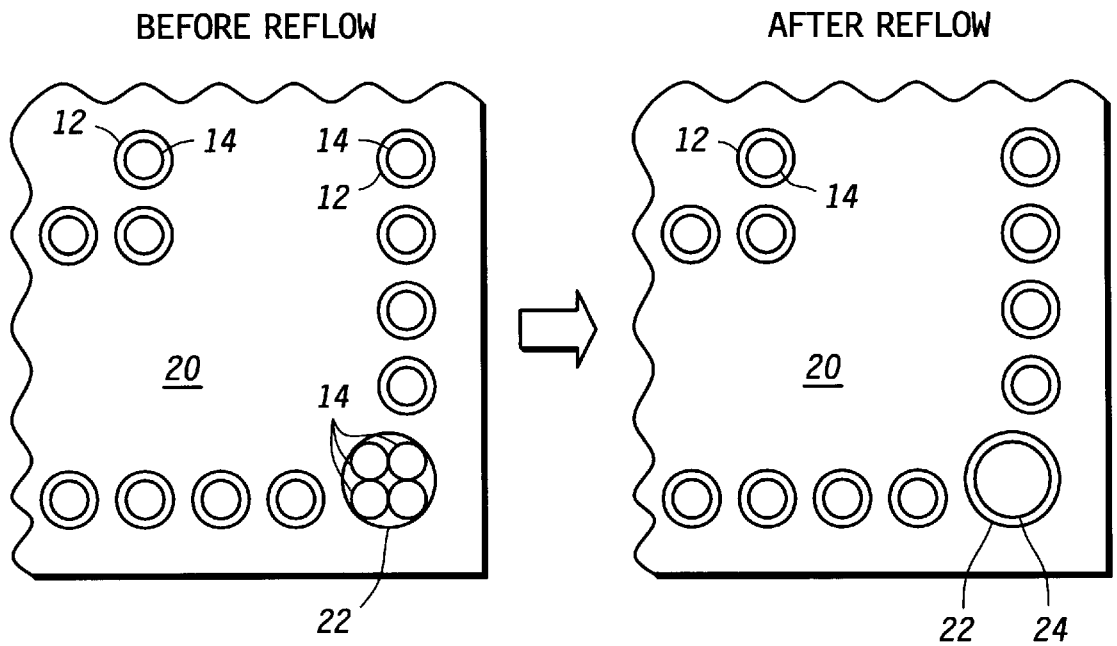
FIG. 5 illustrates an enlarged view of a portion of the ball grid array package of FIG. 4 before and after solder reflow.

FIG. 5 illustrates an enlarged view of a portion of the ball grid array package of FIG. 4 before and after solder reflow in another embodiment of the present invention. Before reflow, the four solder balls 14 can be distinctly identified on pad 22. After reflow, the four metal balls are merged into one larger solder ball 24 on pad 22. Note that any number of solder balls (i.e., two or more) may be included on the larger pads 22 depending on the size of pad, the volume of solder desired, and the required standoff height. By using multiple same size solder balls on the larger pads, the volume of the larger solder balls after reflow becomes an integer multiple of the volume of the deposited solder balls.

Figure 6:
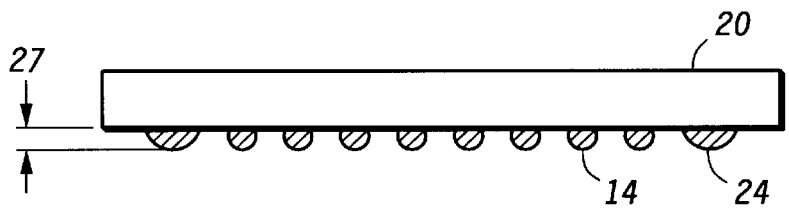
FIG. 6 illustrates a cross sectional view of the ball grid array package of FIG. 4 after solder reflow.

FIG. 6 illustrates a cross sectional view of the ball grid array package of FIG. 4 after solder reflow. A size of metal pad 22 and the volume of solder attached to metal pad 22 determine a standoff height 27. For reliability and ease of assembly, the standoff height 27 should be substantially the same for all of the solder balls where substantially the same is within roughly 10% deviation in height.

Figure 7:
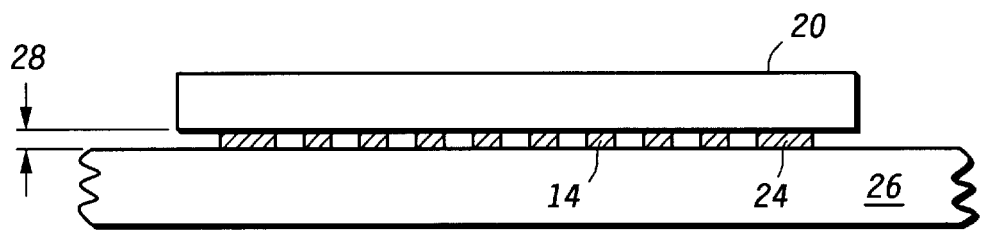
FIG. 7 illustrates a cross sectional view of the ball grid array package of FIG. 6 mounted on a printed circuit board.

FIG. 7 illustrates a cross sectional view of the ball grid array package of FIG. 6 mounted on a printed circuit board 26. A mounted standoff height 28 should also be substantially the same for all of the solder balls after the solder balls are reflowed in order to reliably attach the semiconductor device 20 to the printed circuit board 26.

Figure 8:
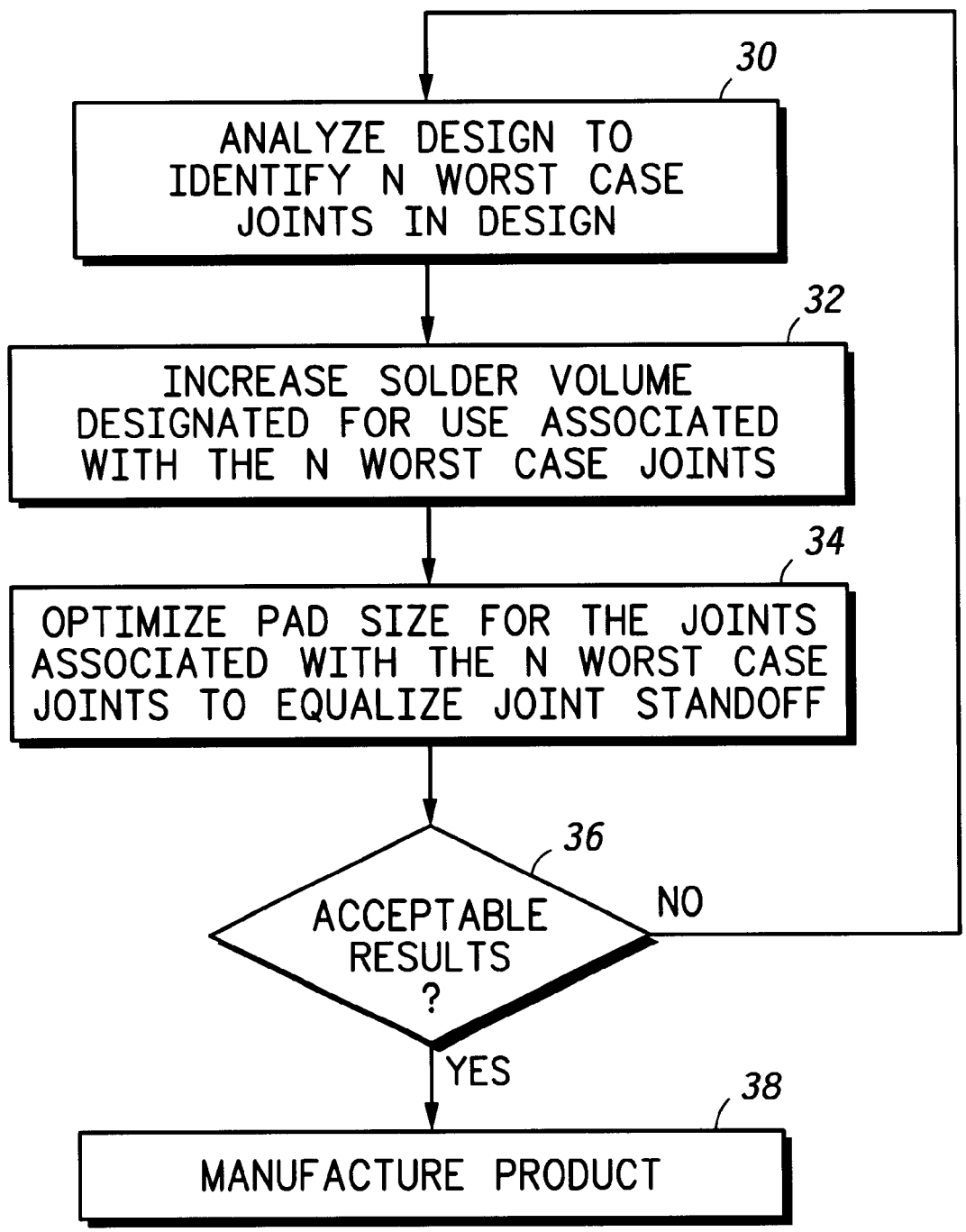
FIG. 8 illustrates a flow chart of a method for designing a ball grid array package in accordance with one embodiment of the present invention.

FIG. 8 illustrates a flow chart of a method for designing a ball grid array package in accordance with one embodiment of the present invention. At step 30, a semiconductor BGA design is analyzed to determine which are the "worst case" solder joints, i.e., which solder joints of the design have the shortest fatigue life. At step 32, an increased solder volume is substituted for the solder balls associated with the N worst case solder joints as determined in step 30, where N is any size subset of the total number of pads on the semiconductor device. Note that either the solder volume of the N worst case joints can be increased or the solder volume of the joints in the vicinity of the N worst case joints can be increased to achieve the same effect. At step 34, the pad size for the pads having the increased solder volume is adjusted and optimized for solder joint standoff height. At step 36, the modified ball grid array package is tested to determine solder joint fatigue life. In the illustrated embodiment, the design is modeled using Ansys finite element analysis. However, in other embodiments, other finite element analysis software can be used. If the fatigue life is improved by an acceptable amount, then the product can be manufactured as in step 38. However, if the fatigue life has not been improved by the required amount, then steps 30 through 36 are repeated until the required fatigue life is demonstrated.

The present invention provides the improved solder joint fatigue life and reliability of ball grid array packages having relatively large solder balls, while maintaining the small solder ball configuration. Also, by using multiple solder balls placed in close proximity on a single enlarged pad to form the larger merged solder ball of increased volume, a manufacturer's current process for placing substantially uniform solder balls can be used. This provides the semiconductor device of the present invention at about the same cost as the ball grid array package having uniformly sized solder balls throughout.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true scope of the invention.

What is claimed is:

1. A method for making a device, the method comprising the steps of:

providing a device containing electrical circuitry, the device having a first plurality of conductive contact regions having a first surface area, and the device having a second plurality of conductive contact regions having a second surface area, wherein the second surface area is substantially larger than the first surface area;

attaching a first plurality of solder balls to the first plurality of conductive contact regions, each of the first plurality of solder balls having a volume X;

attaching a second plurality of solder balls to the second plurality of conductive contact regions, each of the second plurality of solder balls having a volume Y that is substantially greater than the volume X;

reflowing the first and second plurality of solder balls on the first and second plurality of conductive contact regions to provide a first plurality of reflowed solder balls and a second plurality of reflowed solder balls;

wherein a standoff height of the first and second reflowed solder balls are substantially equal before being connected to another surface.

2. The method of claim 1, wherein the device is one of either a packaged ball grid array integrated circuit, a semiconductor die, a printed circuit board, or a substrate portion of a packaged ball grid array integrated circuit.

3. The method of claim 1 wherein a first reflowed solder ball of the second plurality of reflowed solder balls is formed by placing N solder balls onto the second plurality of conductive contact regions where N is greater than or equal to 2.

4. The method of claim 3 wherein the N solder balls are initially physically separate from one another.

5. The method of claim 4 wherein a thermal cycle results in all of the N solder balls merging with each other to form a single larger conductive ball.

6. The method of claim 1 wherein the method comprises the following steps which are all performed before the steps of providing, reflowing and attaching:

analyzing the device to identify a plurality of worst case connection joints in the device;

designating that balls associated with the worst case connection joints are to be increased in volume to the volume Y, while other joints are assigned the volume X; and manipulating the size of the plurality of conductive contact regions associated with the worst case joints on the device to create at least the second plurality of conductive contact regions.

7. The method of claim 6 wherein the steps of analyzing, designating and manipulating are repeated until an acceptable device reliability is obtained.

8. The method of claim 1 wherein volume Y is roughly an integer multiple of the volume X whereby $Y=n*X$ where n is a finite positive integer.

9. The method of claim 1 wherein volume Y is at least one and a half times the volume X.

* * * * *